United States Patent [19]

Vranken

[11] Patent Number: 4,829,401
[45] Date of Patent: May 9, 1989

[54] ROTATING TRANSFORMER WITH FOIL WINDINGS

[75] Inventor: Roger A. Vranken, Eindhoven, Netherlands

[73] Assignee: U.S. Philips Corporation, New York, N.Y.

[21] Appl. No.: 257,252

[22] Filed: Oct. 13, 1988

[30] Foreign Application Priority Data

Oct. 23, 1987 [NL] Netherlands ............. 8702531

[51] Int. Cl.⁴ ............... H05K 7/02; H01F 21/04
[52] U.S. Cl. ....................... 361/380; 336/120; 336/123; 360/108
[58] Field of Search ......... 360/108, 118; 361/380; 336/117, 118, 119, 120, 122, 123, 129, 200

[56] References Cited

U.S. PATENT DOCUMENTS

| | | | |
|---|---|---|---|
| 3,090,933 | 5/1963 | Henry-Baudot | 336/120 |
| 3,179,909 | 4/1965 | Cheney | 336/120 |
| 3,441,888 | 4/1969 | Farrand | 336/129 V |

*Primary Examiner*—Thomas J. Kozma
*Attorney, Agent, or Firm*—F. Brice Faller

[57] ABSTRACT

The transformer comprises a rotor core (1) in the form of a circular ferromagnetic disc which is rotatable about its axis (5), and a stator core (3) in the form of a circular, stationary ferromagnetic disc which is coaxial with the rotor core. The facing main surfaces of these discs are provided with grooves (11, 13) and ridges (15, 17) which are concentric with respect to the axis (5). In the grooves (11, 13) there are provided rotor windings (19) and stator windings (21), respectively. The stator windings (21) consist of conductor tracks on at least one main surface of a circular first portion (25) of a flexible, electrically insulating foil which is connected, via a strip-shaped intermediate portion (27) with connection conductor tracks (41), to a second circular foil portion (29) which supports further conductor tracks (37) and components (39) of an electronic circuit. The first foil portion (25) is secured on the main surface of the stator core (3) provided with grooves (13) and ridges (17) so that the ridges project through segment-shaped cut-outs (33) in the foil. The second foil portion (29) is secured on the other main surface of the stator core (3).

4 Claims, 3 Drawing Sheets

ROTATING TRANSFORMER WITH FOIL WINDINGS

BACKGROUND OF THE INVENTION

The invention relates to a rotating transformer, comprising a rotor core in the form of a circular ferromagnetic disc which is rotatable about its axis, and a stator core in the form of a circular, stationary ferromagnetic disc which is coaxial with the rotor core. The facing main surfaces of the discs have a pattern of grooves which are separated from one another by ridges, which pattern is concentric with respect to the common axis. Rotor windings and stator windings are accommodated in respective grooves, the arrangement being such that each time a rotor winding faces a cooperating stator winding, the stator windings are electrically connected to an electronic circuit outside the grooves.

Rotating transformers of this kind are used inter alia in apparatus for the recording and playback of pictures (video recorders). An example of such a device is described in U.S. Pat. No. 4,497,004. In the known rotating transformers, the rotor and stator windings consist of coils wound from copper wire and subsequently arranged in the grooves in which they are secured, for example by means of glue. The number of coils depends on the number of read and write heads present in the video recorder, because the rotating transformer constitutes the link between the (rotating) read and write heads on the one side and the stationary signal processing circuits on the other side. Because development in video recorders tends towards apparatus comprising ever larger numbers of read and write heads, the number of coils to be included in the rotating transformer also increases. This leads to manufacturing problems and costs because the gluing of the coils in the grooves on the one hand and the connection of the loose connection wires of the stator coils to the associated electronic circuits on the other hand is difficult and time consuming.

SUMMARY OF THE INVENTION

At least the mounting of the stator coils and their connection to the associated electronic circuits is substantially simpler and less time consuming that in the known rotating transformers.

To achieve this, at least the stator windings consist of conductor tracks on at least one of the main surfaces of a circular first portion of a flexible, electrically insulating foil. The first foil portion is connected, via a strip-shaped intermediate portion, to a second circular foil portion which accommodates further conductor tracks on which components of the electronic circuit are arranged and which are electrically connected to the conductor tracks on the first foil portion via connection conductor tracks on the intermediate portion. The first foil portion is secured on the main surface of the stator core which comprises grooves and ridges, the first portion being secured so that the ridges project through segment-shaped cut-outs provided between the conductor tracks in the foil, the second foil portion being secured on the other main surface of the stator core and the intermediate portion being bent around the edge of the stator core.

The flexible foil with the electronic circuit can be manufactured in advance by means of known techniques, after which it need only be secured on the two main surfaces of the stator core, for example by means of glue.

In order to enable a comparatively large number of turns to be fitted within a small space, conductor tracks forming stator windings may be provided on both main surfaces of the first foil portion.

Components of the electronic circuit may be provided on the main surface of the second foil portion which is remote from the stator core, the main surface facing the stator core being covered with an electrically conductive layer. The electrically conductive layer can be grounded, in which case it serves as a screen for the electronic circuit.

The second foil portion may continue into a strip-shaped connection portion which also has conductor tracks for the connection of the electronic circuit. In this embodiment the establishment of the necessary connections between the electronic circuit and further parts of, for example a video recorder is particularly simple.

DETAILED DESCRIPTION OF THE PREFERRED EMBODIMENT

Figure 1:
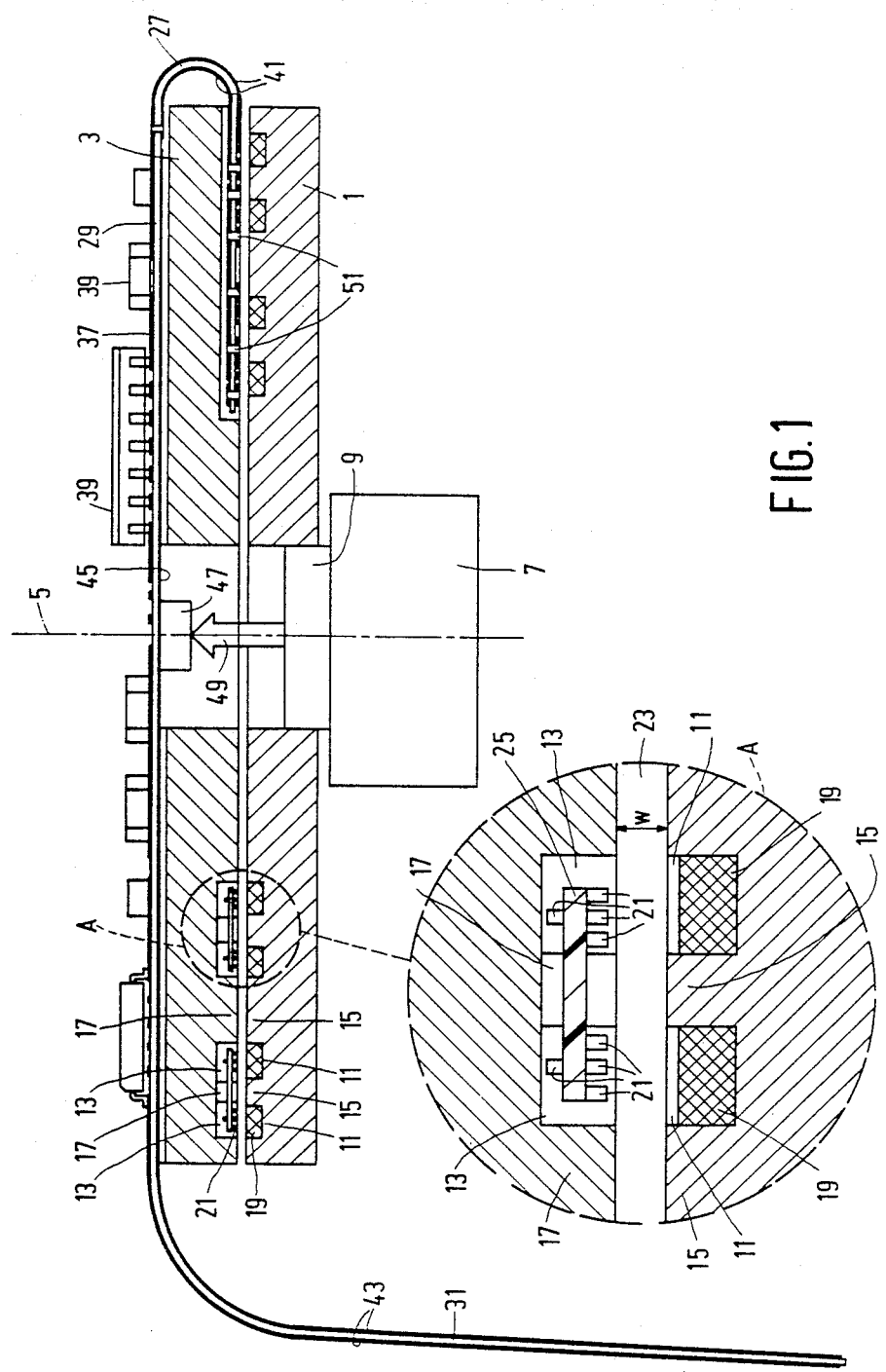
FIG. 1 is a diagrammatic cross-sectional view of an embodiment of a rotating transformer

The rotating transformer which is diagrammatically shown in FIG. 1 includes a rotor core 1 and a stator core 3, each of which consists of a circular disc of a ferro-magnetic material (for example, ferrite). These discs are arranged so as to be coaxial and their common axis 5 is denoted by a stroke-dot line. The rotor core 1 is rotatable about the axis 5 and is driven by a motor 7 which is only diagrammatically shown. To this end, the rotor core 1 is mounted on the shaft 9 of the motor 7. The stator core 3 is stationary.

The facing main surfaces of the rotor core 1 and the stator core 3 are provided with a pattern of grooves 11, 13, respectively (in this case four grooves), which is concentric to the common axis 5, the grooves being separated from one another by ridges 15, 17, respectively. In order to illustrate this, a portion A of the transformer in which some of these grooves and ridges occur is shown at an increased scale in FIG. 1. Rotor windings 9 are provided in the grooves 11 of the rotor 1 there and stator windings 21 are provided in the grooves 13 of the stator core 3. As appears from FIG. 1, the diameters of oppositely situated grooves are the same, so that each rotor winding 19 faces a cooperating stator winding 21. In order to ensure suitable electromagnetic coupling between the cooperating windings 19 and 21, the width w of the air gap 23 between the rotor core 1 and the stator core 3 is as small as possible.

Figure 2:
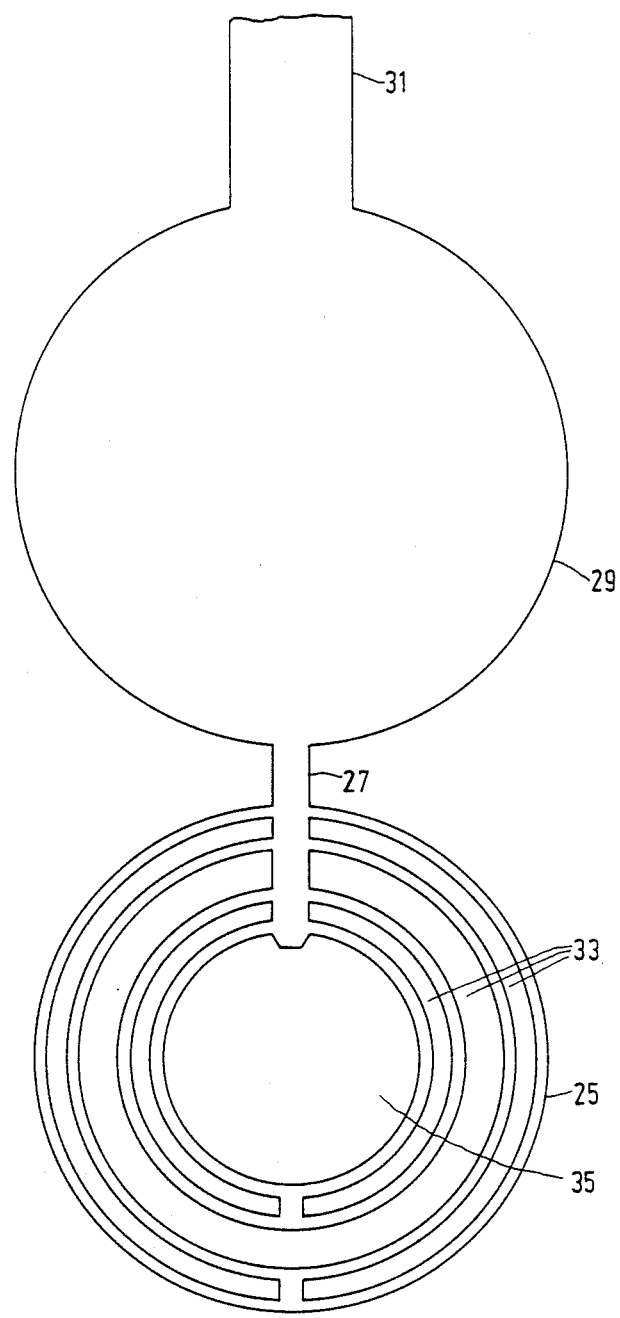
FIG. 2 is a view of a flexible foil as used in the transformer shown in FIG. 1.
Figure 3:
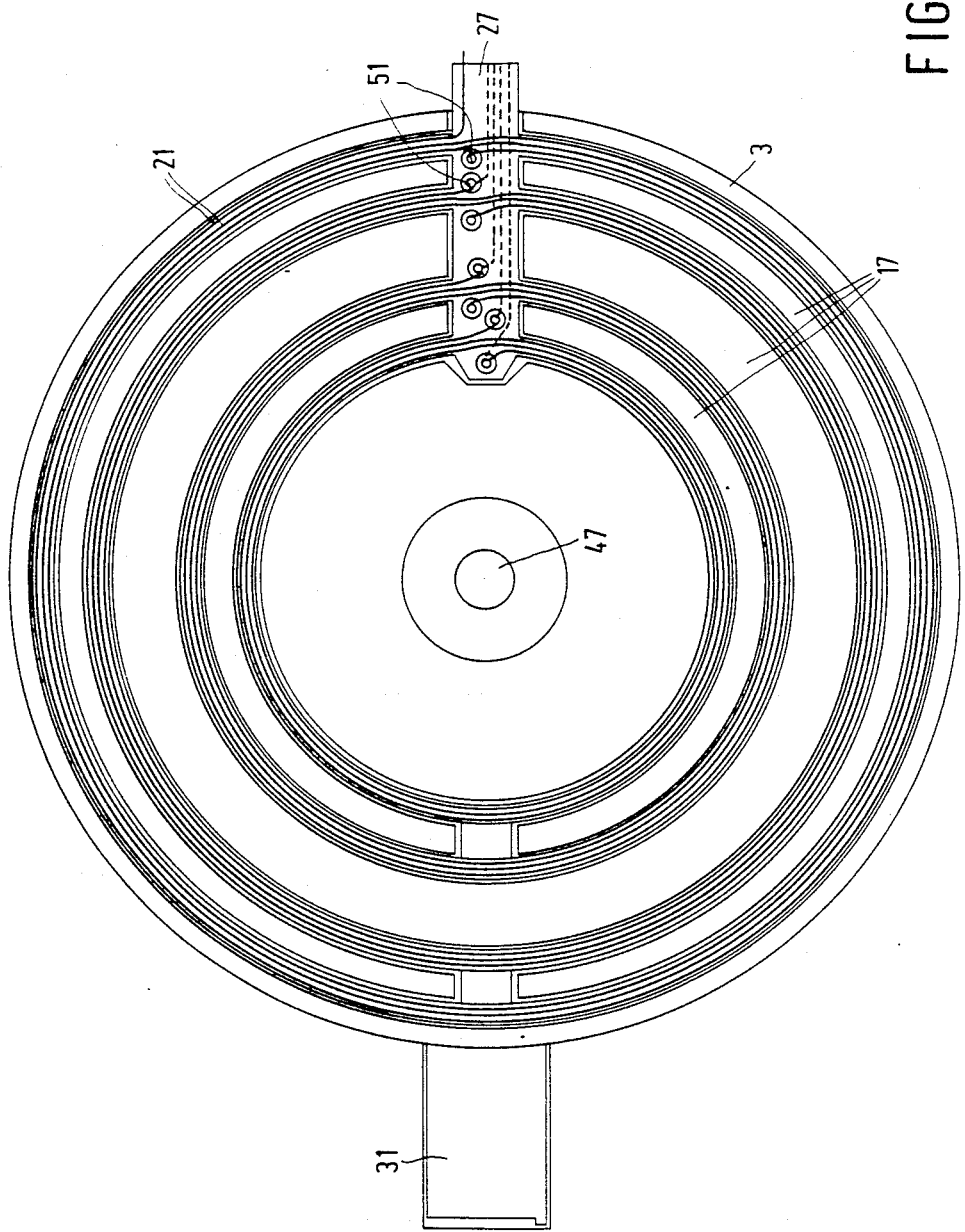
FIG. 3 is a bottom view of the stator of the transformer shown in FIG. 1.

The stator windings 21 consist of conductor tracks which are provided on both main surfaces of a first portion 25 of a flexible, electrically insulating foil. Each stator winding comprises four turns, three of which are situated on one side of the foil, the fourth turn being situated on the other side. The shape of the foil is shown in FIG. 2 in which the conductor tracks have been omitted for the sake of clarity. The first foil portion 25 has a circular shape and is connected, via a strip-shaped intermediate portion 27, to a second circular foil portion 29 which continues, at the side which is remote from the intermediate portion, into a strip-shaped connection portion 31. The first foil portion 25 comprises segment-shaped cut-outs 33 and a substantially circular central aperture 35. The first foil portion 25 is arranged on the grooves 13 and ridges 17 on a main surface of the stator core 3 so that the ridges project through the segment-shaped cut-outs 33 and the foil portions which are situated between these cut-outs and which support the conductor tracks are situated in the grooves (see the FIGS. 1 and 3). The conductor tracks are provided in the manner customarily used for the manufacture of printed circuit boards, for example by covering the foil with an electrically conductive layer (for example, a copper layer) on both sides and by subsequently defining the desired conductor pattern by selective etching. The first foil portion 25 is secured, preferably by means of a layer of glue (not shown), on the main surface of the stator core 3 comprising the grooves 13 and ridges 17. The second foil portion 29 is similarly secured to the oppositely situated main surface of the stator core 3 and the intermediate portion 27 is bent around the edge of the stator core.

The main surface of the second foil portion 29 which is remote from the stator core 3 comprises further conductor tracks on which components 39 of an electronic circuit are provided by means of a known surface mounting technique. This circuit serves for the processing of signals to be applied to or originating from the stator windings 21. To this end, the further conductor tracks 37 are connected, via connection conductor tracks 41 on the intermediate portion 27, to the conductor tracks forming the stator windings 21. The connection portion 31 also comprises conductor tracks 43 for connecting the electronic circuit to further parts of the apparatus (not shown) in which the rotating transformer is arranged.

The main surface of the second foil portion 29 which faces the stator core 3 is completely or substantially completely covered with an electrically conductive copper layer 45. No components are mounted on this layer 45, so that the second foil portion 29 is flatly arranged on the main surface of the stator core 3. The electrically conductive layer 45 serves to shield the components 39 against disturbing electromagnetic effects. On the layer 45 there may be arranged a contact plate 47 which cooperates with a sliding contact 49 secured to the motor shaft 9 in order to ground the motor shaft.

As has already been stated, the conductor tracks on the first foil portion 25, forming the stator windings 21, are preferably situated, on the two main surfaces of this first foil portion. This is desirable in order to enable a sufficient number of turns to be accommodated within the comparatively small width of the grooves 13. In order to establish the necessary electrical connections between the conductor tracks situated on different sides of the first foil portion 25, plated-through holes 51 are provided in the foil in a customary manner (see also FIG. 3).

The rotor windings 19 of the described embodiment consist of coils which are made of copper wire in a conventional manner and which are glued in the grooves 11. Evidently, if desired, these windings can also be formed as conductor tracks on an insulating foil to be provided in the grooves. Because the mounting of the windings is especially simple, if desired the number of rotor and stator windings used may be larger than the four windings used in the described embodiment.

What is claimed is:

1. A rotating transformer, comprising a rotor core in the form of a circular ferromagnetic disc which is rotatable about its axis, and a stator core in the form of a circular, statonary ferromagnetic disc which is coaxial with the rotor core, the facing main surfaces of said discs being provided with a pattern of grooves which are separated from one another by ridges, which pattern is concentric with respect to the common axis, rotor windings and stator windings, respectively, being accommodated in said grooves, the arrangement being such that each time a rotor winding faces a cooperating stator winding, which stator windings are electrically connected to an electronic circuit outside the grooves, characterized in that at least the stator windings consist of conductor tracks on at least one of the main surfaces of a circular first portion of a flexible, electrically insulating foil, which first foil portion is connected via a strip-shaped intermediate portion, to a second circular foil portion which accommodates further conductor tracks on which components of the electronic circuit are arranged and which are electrically connected to the conductor tracks on the first foil portion via connection conductor tracks on the intermediate portion, the first foil portion being secured on the main surface of the stator core which comprises grooves and ridges, the first portion being secured so that the ridges project through segment-shaped cut-outs provided between the conductor tracks in the foil, the second foil portion being secured on the other main surface of the stator core and the intermediate portion being bent around the edge of the stator core.

2. A rotating transformer as claimed in claim 1, characterized in that conductor tracks forming stator windings are provided on both main surfaces of the first foil portion.

3. A rotating transformer as claimed in claim 1 characterized in that the components of the electronic circuit are provided on the main surface of the second foil portion which is remote from the stator core, the main surface facing the stator core being covered with an electrically conductive layer.

4. A rotating transformer as claimed in claim 1, characterized in that the second foil portion continues into a strip-shaped connection portion which also comprises conductor tracks for the connection of the electronic circuit.

* * * * *